United States Patent
Höring

(10) Patent No.: US 12,409,511 B2
(45) Date of Patent: Sep. 9, 2025

(54) METHOD FOR PRODUCING LOAD-INDICATING CONNECTION COMPONENTS, AND CORRESPONDING LOAD-INDICATING CONNECTION COMPONENT

(71) Applicant: intellifast GmbH, Speyer (DE)

(72) Inventor: Gert Höring, Karlsruhe (DE)

(73) Assignee: intellifast GmbH, Speyer (DE)

( * ) Notice: Subject to any disclaimer, the term of this patent is extended or adjusted under 35 U.S.C. 154(b) by 106 days.

(21) Appl. No.: 18/028,810

(22) PCT Filed: Sep. 28, 2021

(86) PCT No.: PCT/EP2021/076590
§ 371 (c)(1),
(2) Date: Mar. 28, 2023

(87) PCT Pub. No.: WO2022/069443
PCT Pub. Date: Apr. 7, 2022

(65) Prior Publication Data
US 2023/0330767 A1     Oct. 19, 2023

(30) Foreign Application Priority Data
Oct. 1, 2020 (DE) .................... 10 2020 125 707.4

(51) Int. Cl.
*B23K 20/16* (2006.01)
*B23K 1/00* (2006.01)
(Continued)

(52) U.S. Cl.
CPC .......... *B23K 20/165* (2013.01); *B23K 1/0006* (2013.01); *G01L 5/24* (2013.01); *H10N 30/875* (2023.02)

(58) Field of Classification Search
None
See application file for complete search history.

(56) References Cited

U.S. PATENT DOCUMENTS 4,294,122 A * 10/1981 Couchman ............. G01N 29/24
                                                                      73/761
6,501,211 B1 * 12/2002 Nasrollahzadeh ... H10N 30/802
                                                                      310/317
(Continued)

FOREIGN PATENT DOCUMENTS

CN       210742190 U   *   6/2020
CN       111 504 542        8/2020
(Continued)

OTHER PUBLICATIONS

International Search Report corresponding to International Patent Application No. PCT/EP2021/076590, mailed Feb. 10, 2022.
(Continued)

*Primary Examiner* — Devang R Patel
(74) *Attorney, Agent, or Firm* — Michael Stanley Tomsa; McAndrews, Held & Malloy, Ltd.

(57) ABSTRACT

The disclosure relates to a method for producing load-indicating connection components. A connection element (10) and a piezoelectric ultrasonic transducer (20) are provided and interconnected. The method comprises forming a layer structure on the surface (14) of the connection element (10). The layer structure comprises, in this order, proceeding from the surface (14) of the connection element (10): a first solder layer (16); a reactive layer (30); a second solder layer (22); and the piezoelectric ultrasonic transducer (20). The reactive layer (30) is designed for an exothermic reaction by activation with heat, with electromagnetic radiation or with electric current. Subsequently, the piezoelectric ultrasonic transducer (20) is pressed toward the connection element (10) in order to produce a specified contact pressure, and the reactive layer (30) is activated. The disclosure also relates to a load-indicating connection component of this type.

15 Claims, 2 Drawing Sheets

(51) Int. Cl.
G01L 5/24 (2006.01)
H10N 30/87 (2023.01)

(56) References Cited

U.S. PATENT DOCUMENTS

| | | | | |
|---|---|---|---|---|
| 6,990,866 | B2 * | 1/2006 | Kibblewhite | ........... F16B 31/02 |
| | | | | 73/761 |
| 10,088,378 | B2 * | 10/2018 | Kibblewhite | ........... G01L 5/246 |
| 2006/0219759 | A1 * | 10/2006 | Duckham | ........... B23K 1/0006 |
| | | | | 228/234.3 |
| 2009/0183572 | A1 | 7/2009 | Zendehroud et al. | |
| 2017/0010167 | A1 | 1/2017 | Tham et al. | |

FOREIGN PATENT DOCUMENTS

| | | | | |
|---|---|---|---|---|
| DE | 10 2013 109879 | | 3/2015 | |
| DE | 102013109879 A1 * | | 3/2015 | ........... B23K 20/165 |
| EP | 0 915 524 | | 5/1999 | |
| EP | 2 010 883 | | 1/2009 | |
| WO | 2010/085942 | | 8/2010 | |
| WO | 2010/096439 | | 8/2010 | |
| WO | 2015/036908 | | 3/2015 | |
| WO | WO-2015138562 A2 * | | 9/2015 | ............ F16B 11/006 |
| WO | WO-2018032106 A1 * | | 2/2018 | ............. E21D 21/00 |

OTHER PUBLICATIONS

Examination Report corresponding to German Patent Application No. DE 10 2020 125 707.4, dated May 26, 2021.

* cited by examiner

METHOD FOR PRODUCING LOAD-INDICATING CONNECTION COMPONENTS, AND CORRESPONDING LOAD-INDICATING CONNECTION COMPONENT

CROSS REFERENCE TO RELATED APPLICATIONS

This application is a 371 of International Patent Application No. PCT/EP2021/076590, filed Sep. 28, 2021, which claims benefit of German Patent Application No. DE 10 2020 125 707.4, filed to the German Patent Office on Oct. 1, 2020, entitled "Method for Producing Load-Indicating Connection Components, and Corresponding Load-Indicating Connection Component," contents of both of which are hereby incorporated by reference in their entirety.

This invention relates to a method for producing load-indicating connection components, wherein a connection element and a piezoelectric ultrasonic transducer are provided and interconnected. Another aspect of the invention relates to such load-indicating connection component.

BACKGROUND

Mechanical connection components, such as screws or bolts, are checked for their pretensioning force in a simple way by means of ultrasonic measurement methods. For this purpose, the signal propagation time of ultrasonic waves is measured, which are coupled into the connection component and coupled out again as an echo signal. The ultrasonic pulses used for excitation can be both signals with a fixed frequency and signals that are composed of different frequency components. In the course of advancing material sciences a multitude of composite and graded materials as well as special alloys have been introduced in recent years, from which connection components such as bolts or screws can be made, whose material properties impose higher demands on a measurement method for determining the pretensioning force.

A reliable measurement of the signal propagation time of the ultrasonic waves in the component requires good coupling between the ultrasonic transducer and the connection component. For example, when an ultrasonic transducer and the connection component are glued to each other, the state of the glue layer has an influence on the quality of the measurement. The state of the glue layer in particular can be strongly dependent on a current temperature and in particular can also change over time due to aging of the glue layer. Furthermore, commonly used glue layers are resistant to chemical influences from the environment only to a limited extent. In particular when using the load-indicating connection components in offshore wind turbines, it is problematic here that commonly used glues often are not resistant to the salt-containing sea air.

From EP 2010883 a connection component comprising a temperature-resistant sensor element is known, in which a piezoelectric ultrasonic transducer is applied onto the connection element by a sputtering method. Glue layers for connecting the connection component and the piezoelectric ultrasonic transducer thereby are avoided.

However, it is disadvantageous here that such vapor deposition methods are expensive. Both the investments for the acquisition of the required vacuum components and the costs for operating and maintaining the same are relatively high. In particular due to the limited volume in the vapor deposition plants, the throughput in the production of the load-indicating connection components decreases exponentially with increasing size of the connection component. The costs per piece likewise rise with increasing size of the connection component. In vacuum plants, in general, load-indicating connection components can only be coated at low cost up to a maximum nominal diameter of M20. For large screws, as they are increasingly used for example in the wind power sector, the end customer must accept increased costs for instrumenting the connection elements with ultrasonic sensors.

From WO 2010/085942 A2 a microsystem is known, which consists of two connection substrates and a structure lying between the connection substrates. The structure comprises a reacted reactive layer system. In one embodiment, the microsystem is a sensor that includes a piezoelectric component. For connecting the connection substrates, a reactive multilayer system is used. The reactive multilayer system comprises at least one surface layer with vertically oriented nanostructures arranged at a distance from each other and areas between the nanostructure, which are filled with a material that is a reaction partner for the material of the nanostructures.

From EP 0 915 524 A1 a piezoelectric device comprising a vibratable element is known, which includes at least two elements that can perform bending vibrations. Each of the elements carries a piezoelectric drive element, and at least one of the elements carries a piezoelectric output element. The drive elements are excited by a voltage that causes a transverse or longitudinal deformation of the piezoelectric drive element. The vibration in turn induces a bending vibration of the elements. The output element likewise includes a piezoelectric element and includes electrodes for tapping an electric voltage. The device can be used for example as a filter or as a transformer. For connecting the piezoelectric elements to the vibratable element, a reactive metal thin film can be used.

From WO 2010/096439 A1 a resonance sensor is known, which as an active element comprises a two-layer system of an active piezoelectric layer and a passive layer, which are coupled to each other. For producing the two-layer system a wafer made of the piezoelectric material is metallized on both sides. As a passive layer, a wafer made of aluminum oxide is likewise provided with a metallization and conventionally or reactively soldered to the active layer.

One object of the invention can be seen in providing a method for producing a reliable load-indicating component resistant to temperature and chemical influences, which is simple to configure and provides for a large throughput.

SUMMARY

There is proposed a method for producing load-indicating connection components, in which a connection element and a piezoelectric ultrasonic transducer are provided and interconnected. The method comprises the forming of a layer structure on the surface of the connection element, which in this order, proceeding from the surface of the connection element, comprises optionally a first solder layer, a reactive layer, optionally a second solder layer and the ultrasonic transducer. The reactive layer is adapted for an exothermic reaction by activation with heat, electromagnetic radiation or electric current. After forming the layer structure, the ultrasonic transducer is pressed in the direction of the connection element to generate a specified contact pressure. While the layer structure is pressed, the reactive layer is activated.

After the reactive layer has fully reacted, the ultrasonic transducer is firmly soldered to the connection element. Pressing is terminated, and the finished load-indicating connection component can be removed from a corresponding apparatus for applying the pressing pressure.

When the layer structure is formed, the first solder layer always is employed when the surface of the connection component itself cannot perform the function of a solder layer, i.e. is not directly suitable for soldering. Correspondingly, the second solder layer always is employed when the surface of the ultrasonic transducer is not suitable for direct soldering. For example, when a piezoelectric ultrasonic transducer is used, a second solder layer is employed.

A surface of a connection element suitable for direct soldering in particular can be present already when the surface of the connection element already is coated with a solderable material, for example in the form of a corrosion protection layer. Suitable directly solderable surface coatings comprise in particular pure zinc layers, applied by hot-dip galvanizing or electroplating.

Preferably, both a first and a second solder layer are employed in the layer structure in order to enable optimum soldering of the ultrasonic transducer to the connection element.

Heat is produced by activating the reactive layer. When corresponding solder layers are present, this heat at least partly causes melting of the first solder layer and/or of the second solder layer and thus provides for a connection between the system of the reactive layer fully reacted then and the solder layers, and hence between the surfaces of the connection element and the ultrasonic transducer. If the surface of the connection element itself is suitable as a solder layer, the first solder layer can be omitted, wherein then the heat of the reactive layer at least partly causes melting of the surface of the connection element. Correspondingly, the second solder layer can be omitted when the surface of the ultrasonic transducer is suitable for direct soldering.

The activation of the reactive layer can be effected for example by heating with a laser beam that is focused onto a surface of the reactive layer. Alternatively, the reactive layer for example can be contacted with an electrode, and an electric current can be introduced to briefly locally heat the reactive layer. The connection element here serves as a second electrode.

Preferably, the connection element is a screw and preferably the surface of the connection element is a surface of the screw head of the screw or a surface at the end of the screw opposite to the screw head. The method in principle is suitable for screws of any size and shape, wherein the advantages of the method are particularly apparent in particular in larger screws from a size of M20.

Preferably, the connection element is made of steel, stainless steel, high-alloy steels, special steels, titanium and its alloys, TiAl6V4, aluminum and its alloys, nickel alloys (Inconel), amagnetic steels such as A286, brass or copper and its alloys.

The piezoelectric ultrasonic transducer preferably comprises a piezoelectric element that is adapted to generate vibrations in the ultrasound on excitation with a corresponding electrical signal. For inputting an electrical signal, the piezoelectric ultrasonic transducer preferably comprises an electrode on a surface, which for example can be designed as a printed electrode or as an electrode coated with a vapor deposition method. When the layer structure is formed, this surface provided with the electrode faces away from the surface of the connection element so that the electrode is accessible.

In particular, the electrode can be a thick-film electrode produced by means of imprinting with a thickness in the range of for example 5 μm to 10 μm. For example, a paste containing silver is imprinted by means of a screen printing method. Alternatively, the electrode in particular can be a thin-film electrode with a typical thickness of about 1 μm, which can be obtained for example by sputtering nickel-chromium, gold or silver onto the same.

In the produced load-indicating connection component the surface of the connection element preferably serves as a counter electrode. Advantageously, the fully reacted reactive layer and the possibly present solder layers provide for a good electrical connection to the side of the ultrasonic transducer facing the connection component.

The piezoelectric element preferably is made from a piezoelectric ceramic such as lead-zirconate-titanate (PZT).

The piezoelectric ceramic can be provided for example in the form of a disk. The disk for example can have a diameter in the range of 1 mm to 10 mm, preferably in the range of 2 mm to 5 mm. Typical thicknesses lie in the range of 0.1 mm to 0.75 mm, preferably in the range of 0.25 mm to 0.5 mm. Beside having the shape of a disk, piezoelectric ceramics can also be provided with a square or rectangular base area having edge lengths of 1 to 10 mm, preferably in the range of 2 mm to 5 mm. Here as well, typical thicknesses lie in the range of 0.1 mm to 0.75 mm, preferably in the range of 0.25 mm to 0.5 mm.

In one embodiment of the method, the layer structure is formed by applying the first solder layer onto the surface of the connection element and applying the second solder layer onto the ultrasonic transducer, cutting a reactive bonding foil that comprises the reactive layer, placing the reactive bonding foil onto the first solder layer on the connection element, and placing the ultrasonic transducer onto the bonding foil, wherein the second solder layer points in the direction of the bonding foil.

In this variant of the method a second solder layer is used beside the first solder layer on the surface of the connection element, which second solder layer is applied on the side of the piezoelectric ultrasonic transducer facing the bonding foil. The solder layers can be applied for example by applying molten solder or by a vapor deposition method. The first and/or the second solder layer possibly can be omitted, if the corresponding surface of the connection element or of the ultrasonic transducer is suitable for direct soldering.

In one variant of the method a bonding foil is used, which beside the reactive layer structure is already soldered on both the upper and the lower side and thus comprises the first and the second solder layer. Hence, the application of a first solder layer onto the connection element and of a second solder layer onto the ultrasonic transducer can be omitted. This variant of the method requires that it is possible to apply solder onto each of the sides of the connection element and of the ultrasonic transducer facing the bonding foil. This means that in this case no additional layers, such as an adhesion-promoting intermediate layer, are required for connection to the corresponding surface of the connection element and of the ultrasonic transducer, respectively.

Preferably, the bonding foil is cut to size in such a way that the shape of the bonding foil corresponds to the shape of the ultrasonic transducer. In this case, an activation of the reactive layer preferably is effected by introducing the required activation energy from the side of the reactive layer.

Alternatively, the bonding foil preferably is cut to size in such a way that a part of the bonding foil is not covered by the ultrasonic transducer after placing the piezoelectric ultrasonic transducer onto the same. For example, the shape of the bonding foil therefor can generally be chosen larger or include a form of tab that is not covered by the ultrasonic transducer. In this case, an activation of the reactive layer can be effected from the upper side of the bonding foil.

Cutting the bonding foil to size can be effected mechanically, for example by using a rolling knife. Particularly preferably, cutting the reactive bonding foil to size is effected by means of laser cutting. There is preferably used a short-pulse laser, in particular an ultrashort-pulse laser (USP laser), in order to cut the bonding foil without activating the reactive system of the bonding foil. The pulse duration of the laser pulses lies in the picosecond (ps) or femtosecond (fs) range.

As an alternative to providing the reactive layer in the form of a bonding foil, the layer structure can be formed by coating a surface of the ultrasonic transducer with a second solder layer and the reactive layer system. Subsequently, the coated ultrasonic transducer is placed onto the surface of the connection element, with the reactive layer facing the surface of the connection element. The surface of the connection element previously is provided with the first solder layer. If the surface of the ultrasonic transducer is directly solderable, the second solder layer can be omitted. If a first solder layer is required, the same can be applied onto the surface of the connection element.

The first solder layer, if present, and/or the second solder layer, if present, preferably are made from a metal, such as gold, silver, tin and zinc or a metal alloy. A suitable metal layer for example is a tin layer. The first and/or the second solder layer in particular can be applied onto the corresponding surface as a film, molded part, powder or paste, or can be applied by electroplating or by a vapor deposition method.

Alternatively, the first solder layer, if present, and/or the second solder layer, if present, preferably consist of a so-called active solder. Active solders are metallic solders, which due to their alloy composition are capable of also wetting non-metallic inorganic materials beside metallic surfaces. As a solder material, such active solders include components of silver, nickel, copper and gold, and so-called active elements such as titanium, hafnium, zirconium or vanadium, which only provide for the soldering process. Suitable active solders are available for example under the name Incusil®. Incusil® ABA for example is an alloy of silver, copper, indium and titanium and is suitable for direct application to ceramic surfaces. The active solder in particular can be applied onto the corresponding surface as a film, molded part, powder or paste, or can be applied by electroplating or by a vapor deposition method.

Alternatively, the first solder layer, if present, and/or the second solder layer, if present, preferably consist of a layer system that comprises at least one adhesion-improving intermediate layer and a layer of a solder material as main layer.

Suitable adhesion-improving intermediate layers in particular include layers consisting of titanium, chromium or nickel-chromium. A main layer of the layer system comprises the actual solder material, such as e.g. gold, silver, tin and zinc.

Preferably, the at least one adhesion-improving intermediate layer is obtained by coating the surface of the connection element, a surface of the reactive layer or a surface of the piezoelectric ultrasonic transducer. The further layer comprising the solder can be obtained correspondingly by coating the respectively free surface of the intermediate layer with the solder material.

A total thickness of the first solder layer, if present, and/or of the second solder layer, if present, preferably lies in a range of 10 µm to 200 µm, particularly preferably in a range of 20 to 100 µm, and for example is 30 µm.

For example, the solder layers can be designed as a tin layer having a thickness of 30 µm.

When the first and/or the second solder layer is designed as a layer system, the thickness of the adhesion-improving intermediate layer preferably is chosen in the range of 10 nm to 1 µm, and the thickness of the main layer, which comprises the solder material, preferably is chosen in the range of 20 µm to 100 µm.

For producing a stable connection between the ultrasonic transducer and the connection element it is provided to press the ultrasonic transducer against the connection element with a defined contact pressure at least during the connecting operation. It thereby is achieved that on melting of the solder layer(s) a full-surface and defined connection is produced. The specified contact pressure preferably is specified in the range of 0.3 Mpa to 3 Mpa, and for example is 100 psi (about 0.69 MPa).

Furthermore, it can be provided to carry out the connecting operation in a protective gas atmosphere or in a vacuum. For carrying out the connecting operation in a vacuum, the connection element with the layer structure formed thereon can be introduced into a recipient, the air can be evacuated, and subsequently the connecting operation can be started by activating the reactive layer. During this operation, the specified contact pressure is exerted for example by a pressing device likewise incorporated into the recipient. After cooling, the connecting operation is terminated and the load-indicating connection component obtained can be removed.

For carrying out the connecting operation in a protective gas atmosphere, this operation can be carried out in a corresponding chamber, analogously to being carried out in a vacuum. Alternatively, it can also be provided to merely locally displace the ambient air by flowing against the formed layer system. A suitable protective gas is argon, for example.

By carrying out the connecting operation in a protective gas atmosphere or in a vacuum, the quality of the solder connection obtained can be increased, as in particular an oxide formation involving atmospheric oxygen is suppressed.

Preferably, the reactive layer or the reactive layer system comprises a system of alternating layers, wherein the alternating layers are selected from Ni/Al, Al/Pd, Al/Ti and combinations of these alternating layers.

Preferably, coating is effected to produce the solder layers, the reactive layer and/or the at least one intermediate layer by using a vapor deposition method, in particular by using a physical vapor deposition (PVD) method or a chemical vapor deposition (CVD) method.

Sputtering is a preferred PVD method, in which atoms are removed from a sputtering target by ion bombardment in a vacuum chamber, which atoms subsequently are deposited on the substrate to be coated.

A production of the reactive layer can be effected for example by providing a substrate holder and by placing a number of piezoelectric ceramic sensors on the substrate holder. Subsequently, a reactive layer that comprises a plurality of individual layers is vapor-deposited on the piezoelectric material. The plurality of individual layers forms a reactive layer system.

Preferably, the reactive layer or the reactive layer system has a total thickness in the range of 10 µm to 100 µm.

Corresponding to the properties of the solder layer(s) and preferably in dependence on the thickness of the piezoelectric ultrasonic transducer employed and the set contact pressure, the thickness of the reactive layer is chosen in such a way that on the one hand enough energy is provided on activation of the reactive layer to accomplish a secure connection, and on the other hand the piezoelectric ultrasonic transducer is not mechanically damaged by the thermal energy released for a short time.

Correspondingly, the thickness of the reactive layer or the reactive layer system is chosen in dependence on the amount of heat released after activation. The released amount of heat preferably is dimensioned such that the first solder layer and, if present, the second solder layer is at least partially melted.

Suitable reactive layers are available in the form of bonding foils under the name NanoFoil® of the firm Indium Corporation. These reactive layer systems consist of alternating layers of nickel and aluminum and are available with total thicknesses in the range of 40 µm to 80 µm. The maximum temperature during the reaction lies in the range of 1350° C. to 1500° C., wherein the amount of heat released lies in the range of 1050 to 1250 J/g. After activation of the reactive layer system, the fully reacted system has a composition of $Ni_{50}Al_{50}$.

Preferably, the surface of the connection element is zinc-plated, in particular hot-dip galvanized. In this configuration, zinc plating serves as a first solder layer.

Preferably, the surface of the connection element is designed such that no embossments and markings are present in the region of the screw head on which the ultrasonic transducer is to be mounted. More preferably, the corresponding surface is flat, which provides for directly mounting the ultrasonic transducer without prior mechanical treatment of the screw head.

The invention furthermore relates to a load-indicating connection component, obtained by one of the methods described herein. The load-indicating connection component comprises a connection element and a layer structure comprising a piezoelectric ultrasonic transducer, which is arranged on the surface of the connection element, wherein the layer structure comprises a reacted reactive layer and the ultrasonic transducer on the surface of the connection element in this order proceeding from the surface of the connection element.

Between the surface of the connection element and the reacted reactive layer, there can be arranged parts of a first solder layer that has bonded to the surface of the connection element due to the reaction heat of the reactive layer and has partly fused with the reactive layer. If a second solder layer has been used, parts of the second solder layer, which possibly have partly fused with the reacted reactive layer, correspondingly are present between the reacted reactive layer and the ultrasonic transducer.

Advantages of the Invention

The conventional glueing of piezoelectric ceramic sensors, such as e.g. lead-zirconate-titanate disks (PZT disks), involves various disadvantages. Beside the strong temperature dependence and the aging of the glue layer, the lack of resistance of the same towards chemical environmental influences, there are also increased requirements with respect to the roughness and flatness of the surface of the connection element to which the piezoelectric element is to be glued. In general, connection elements must be partially processed mechanically, preferable be milled, before the piezoelectric element can be applied. Furthermore, a connection by glueing requires the observance of drying or curing times until the glued joint is stable and loadable.

In accordance with the invention, these disadvantages are overcome by using a soldering process. The soldering process can compensate for imperfections in the surfaces of the components to be connected, as the solder can completely fill the space between the components. Soldering leads to a permanent and stable connection between the components. In addition, with respect to its transmission parameters for ultrasound, the solder has similar properties as those of the metallic material of the connection element.

In usual soldering processes, the connection element must be heated in its entirety for a safe connection before the actual soldering operation to such an extent that the heat introduced during the soldering operation is sufficient to melt the solder between the connection element and the piezoelectric ceramic sensor.

Completely heating the connection element before actually soldering is very expensive, however, and often not permissible due to the required high temperatures. For the above reasons, conventional soldering for applying piezoelectric ceramic sensors onto connection elements cannot be used in general.

The proposed method supplies the heat necessary for soldering via a reactive layer arranged between the parts to be connected of the load-indicating component. The energy released for a short time on activation of this reactive layer is sufficient to generate such temperatures on a locally limited scale also in connection elements having a large thermal mass, such as for example wind turbine screws, which provide for a secure connection between connection element and piezoelectric ultrasonic transducer.

As the heat is abruptly released for a short period, heating advantageously remains substantially limited to the reactive system itself, the adjoining solder layer(s) and a small area on the surface of the connection element or the piezoelectric element. Damage to the components to be connected thereby is avoided, and a secure solder connection nevertheless becomes possible.

DESCRIPTION OF THE DRAWINGS

Exemplary embodiments of the invention are shown in the drawings and will be explained in detail in the following description, in which.

DESCRIPTION

Figure 1:
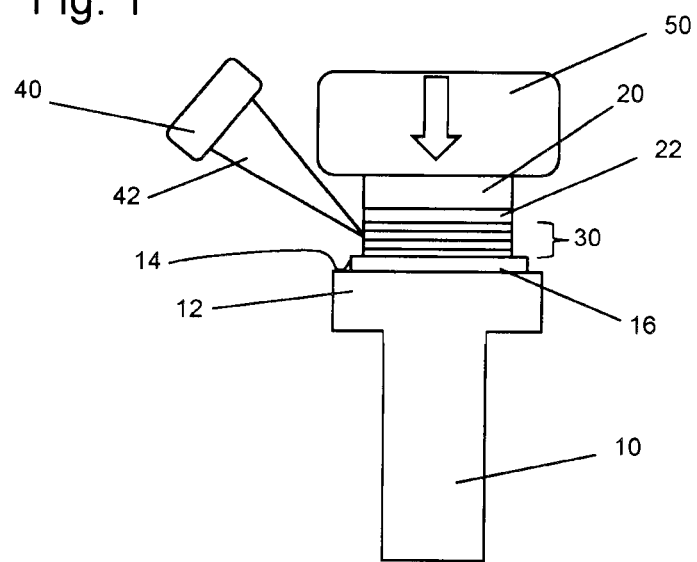
FIG. 1 shows the connection of an ultrasonic transducer to a connection element by using a reactive layer system before reacting of the reactive layer system.

In the following description of the exemplary embodiments of the invention like components and elements are designated with the same reference numerals, wherein a repeated description of these components or elements is omitted in individual cases. In the Figures, the subject-matter of the invention is only shown schematically.

FIG. 1 schematically shows the production of a load-indicating connection component 1. An ultrasonic transducer 20 and a connection element 10 are interconnected by using a reactive layer system 30.

In the situation shown in FIG. 1, the connection element 10 is a screw. The ultrasonic transducer 20 is to be connected to the surface 14 of the connection element 10 in the region of a screw head 12 of the screw. The connection is to be accomplished by a soldering process. For this purpose, the surface 14 is provided with a first solder layer 16, and a surface of the ultrasonic transducer 20 was provided with a second solder layer 22.

For example, the surface 14 of the connection element 10 and a surface of the ultrasonic transducer 20 can be provided with a tin coating as a first solder layer 16 and a second solder layer 22 in a simple way by means of the PVD method of sputtering.

For producing a stable solder connection between the connection element 10 and the ultrasonic transducer 20, the two solder layers 16 and 22 must be melted at least on their surfaces so that they can form a materially bonded (stoffschlüssige) connection. For this purpose a reactive layer 30 is provided, which comprises a reactive layer system of alternating layers. For example, nickel layers and aluminum layers are arranged in alternation. The reactive layer system is configured in such a way that after activation, for example via introduced heat, the thermal energy necessary for the production of the solder connection is released in an exothermic reaction.

In the layer system formed on the surface 14 of the connection element 10, the reactive layer 30 is arranged between the first solder layer 16 and the second solder layer 22. In the example shown in FIG. 1, the surface of the reactive layer 30 is chosen such that the same corresponds to the surface of the ultrasonic transducer 20, so that the ultrasonic transducer 20 completely covers the reactive layer 30. The total thickness of the reactive layer 30 is chosen such that the reaction of the reactive layer releases enough heat to at least melt the first and second solder layers 16, 22 and materially (stoffschlüssig) connect them to the reactive layer 30. After activation, the reactive layer 30 releases the heat within a short time so that the ultrasonic transducer 20 and the connection element 10 are hardly heated.

For activation of the reactive layer 30, activation energy must be supplied. In the example outlined in FIG. 1, a laser beam 42 therefor is focused from the side onto the reactive layer 30 by means of a laser 40 and in this way introduces the necessary activation energy at the edge of the reactive layer 30. When the reactive layer 30 is cut to size such that its surface area is greater than that of the ultrasonic transducer 20, the activation energy can also be introduced on the upper side of the reactive layer 30. After activation of the reactive layer 30, the same is heated via an exothermic reaction between the contained alternating layers, wherein the reaction spreads over the entire volume of the reactive layer 30 and melts the reactive layer 30 as well as parts of the adjoining solder layers 16, 22.

In order for the melted layers to form an intimate connection and for possibly existing surface irregularities to be filled and compensated for by the melted material, it is provided to press the ultrasonic transducer 20 against the connection element 10 with a defined contact pressure during the soldering operation. In the example shown in FIG. 1, the pressing force necessary for generating the defined contact pressure is transmitted to the ultrasonic transducer 20 via a punch 50.

After cooling, the solder connection between the connection element 10 and the ultrasonic transducer 20 is produced and the punch 50 can be removed. As the reaction taking place in the reactive layer 30 is fast, bonding generally takes less than one second.

Figure 2:
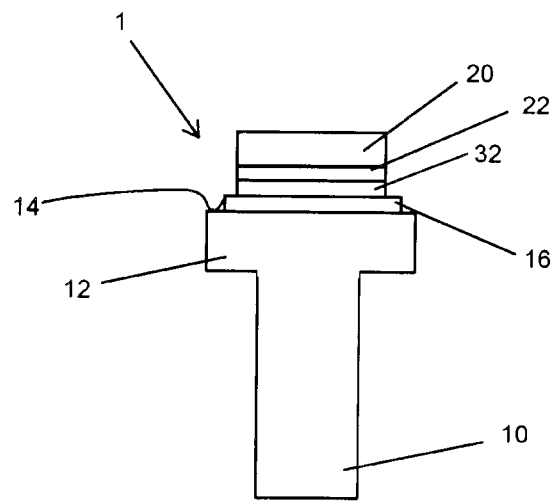
FIG. 2 shows the load-indicating connection component with the connected ultrasonic transducer.

FIG. 2 shows a load-indicating connection component 1 obtained according to the method outlined in FIG. 1. The connection component 1 comprises the connection element 10, which in the present example is designed as a screw, and the ultrasonic transducer 20, which are materially (stoffschlüssig) connected by a solder connection. Between the surface 14 of the connection element 10 and the reacted reactive layer 32, parts of the first solder layer 16 are arranged, which has bonded to the surface 14 of the connection element 10 due to the reaction heat of the reactive layer 30 and has partly fused with the reacted reactive layer 32. Parts of the second solder layer 22 are located between the reacted reactive layer 32 and the ultrasonic transducer 22, wherein parts of the second solder layer 22 are fused with the reacted reactive layer 32.

Figure 3:
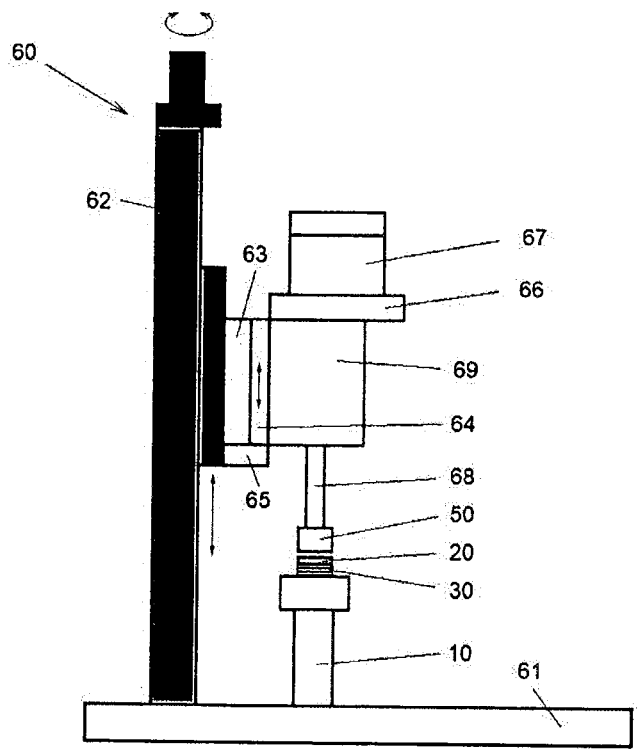
FIG. 3 shows a schematic view of a pressing device for generating a defined contact pressure.

FIG. 3 shows a schematic view of a pressing device 60 for generating a defined contact pressure for pressing the ultrasonic transducer 20 against the connection element 10 during the soldering operation.

The pressing device 60 comprises a base 61 on which the connection element 10 is placed together with the layer system, which is formed on its surface 14 and comprises the reactive layer 30 and the ultrasonic transducer 20. The pressing device 60 furthermore comprises a linear unit 62 for height adjustment. A linear guideway 63 comprising a movable carriage 64 and a stop 65 is mounted on the linear unit 62. A spring pin receptacle 69 with a platform 66 is attached to the carriage 64 of the linear guideway. The movable carriage 64 initially rests on the stop 65.

The platform 66 serves as a support for movable weights 67. In the example of FIG. 3 a single weight 67 is shown, but it is also possible to use several weights 67 in order to specify the desired pressing force. The spring pin receptacle 69 acts as a holder for a spring pin 68 whose function it is to transmit the pressing force to the ultrasonic transducer 20 as a defined contact pressure. The spring pin 68 therefor is pretensioned into a completely extended position by means of a spring. For transmitting the contact pressure, the spring pin 68 includes a punch 50 that acts as a contact surface at its end facing the ultrasonic transducer 20.

After placing the connection element 10 together with the layer system, which at least comprises the reactive layer 30 and the ultrasonic transducer 20, the stop 65 is lowered by using the linear unit 62, wherein the components connected to the movable carriage 64 received in the linear guideway 63, namely the spring pin 68, the spring pin receptacle 69, the platform 66, the weights 67, likewise are lowered following the stop 65.

During lowering, the ultrasonic transducer 20 is contacted via the punch 50 of the spring pin 68. During further lowering, the force exerted on the ultrasonic transducer 20 rises, while the spring pin 68 is increasingly retracted. For example, a spring action of the spring pin 68 can be chosen such that a pressing force in the range of 1 to 3 N up to complete retraction of the spring pin 68 is achieved.

After complete retraction of the spring pin 68, the spring pin receptacle 69 no longer rests on the stop 65 and moves in its linear guideway 63 relative to the stop 65, when the stop 65 is further lowered by means of the linear unit 62. As a result, the full weight force of the weight 67, the platform 66, the spring pin receptacle 69 and the spring pin 68 is transmitted to the ultrasonic transducer 20.

The pressing force correspondingly is specified by choosing the mass of the weights 67. The pressing force is transmitted to the ultrasonic transducer via the contact surface of the spring pin 68, wherein the contact pressure is defined by the weight force and the surface area of the ultrasonic transducer 20.

The size of the punch 50 of the spring pin 68 is to be chosen such that its contact surface as far as possible corresponds to the surface area of the ultrasonic transducer 20 facing the spring pin 68. The pressing device 60 is designed such that spring pin receptacle 69 and spring pin 68 are easy to change in order to ensure a fast adaptation to changing sizes of the ultrasonic transducer.

Figure 4:
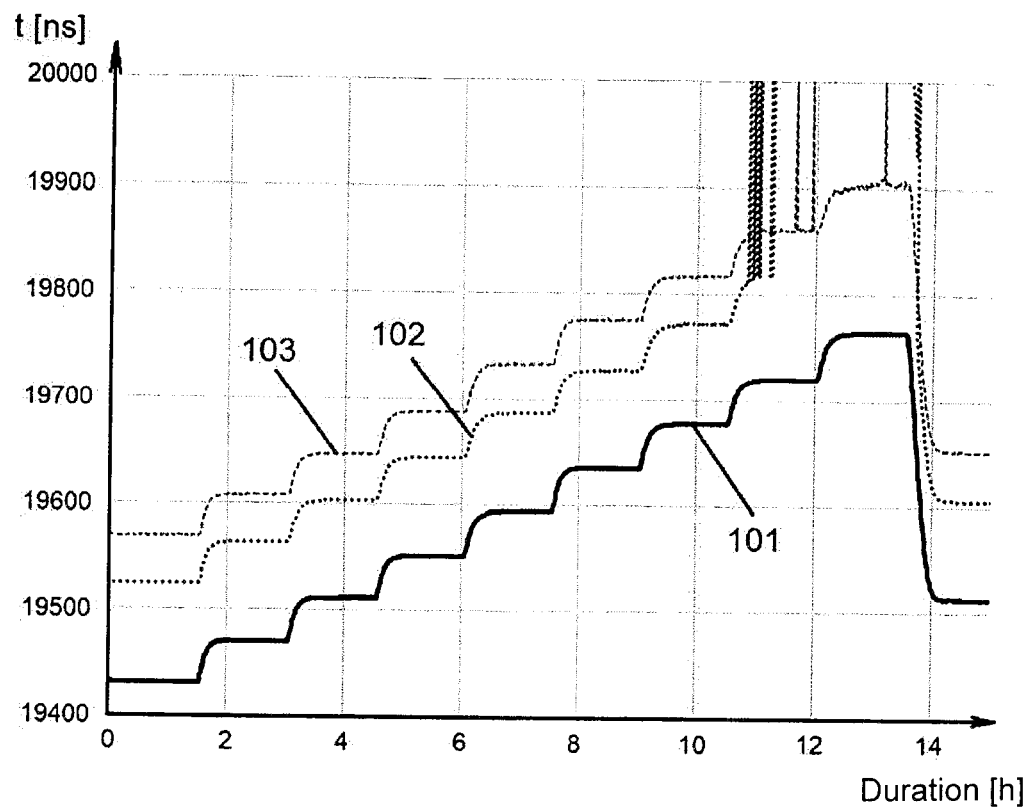
FIG. 4 shows a comparative measurement between a load-indicating connection component according to the invention and two comparative examples.

FIG. 4 shows a comparative measurement of the ultrasound propagation times for a load-indicating connection component according to the invention, in which the ultrasonic transducer is soldered to the connection element, as compared to two load-indicating connection components as comparative examples in which the ultrasonic transducer according to the prior art has been attached by glueing. The diagram of FIG. 4 represents the measured sound propagation time t for a time-of-flight measurement in dependence on the temperature T of the respective connection component.

In a time-of-flight measurement by using the ultrasonic transducer, an ultrasonic signal is emitted in the form of a time-limited pulse. The ultrasonic pulse passes through the connection element and is reflected at an end of the connection element. The reflected ultrasonic signal is then measured again as an ultrasonic echo. The sound propagation time t is the period of time that has passed since the emission of the ultrasonic pulse until receipt of the ultrasonic echo.

The load-indicating connection components used each include identical M12×50 screws made of steel as connection element. On the screw head of the M12×50 screws, ultrasonic transducers each are mounted.

What is used as an ultrasonic transducer is a piezoceramic having a diameter of 5 mm and a thickness of 0.5 mm.

In the load-indicating connection component according to the invention, the ultrasonic transducer has been soldered to the screw by using a bonding foil. For this purpose, both the screw head and the piezoceramic were provided with tin solder layers. For this purpose, tin layers having a thickness of 30 μm were deposited on the surfaces by a sputtering method.

For connecting the ultrasonic transducer to the screw, an Al/Ni bonding foil NanoFoil® having a thickness of 40 μm of the firm Indium Corporation was used, which was cut to size by short-pulse laser cutting to have the diameter of the ultrasonic transducer.

In both comparative examples, the ultrasonic transducer was glued onto the screws. For the first comparative example, an anaerobic acrylate glue was used, for the second comparative example an epoxy glue.

FIG. 4 shows the measured propagation times in dependence on the temperature for the three M12×50 screws. A first curve 101 shows the measured sound propagation times for the load-indicating connection component according to the invention. A second curve 102 shows the measurements of the sound propagation times for the first comparative example, and a third curve 103 shows the measurements of the sound propagation times for the second comparative example. For all three curves 101, 102, 103 it can be seen that the measured sound propagation time rises with increasing temperature.

Starting at −20° C., the propagation times of the screws incrementally increase with each temperature level. Rising the temperature is effected in 20 K steps. Up to the temperature level of 100° C., the curves 101, 102, 103 extend analogously. For the temperature levels 120° C. and 140° C., both glued ultrasonic transducers show signs of failure according to the comparative examples, recognizable by the abrupt upward deflections. The same are caused by the temporary loss of contact of the electrode on the side of the ultrasonic transducer facing the screw head. When users or automated measurement systems do not recognize these problems, this results in faulty measurements. What is likewise problematic, because not always recognizable immediately, are changes in the echo structure of the ultrasonic signals, which are caused by thermal influences or influences of the environment on the glue layer and its aging. These problems also lead to false measurement results. By using ultrasonic transducers applied by means of a bonding foil, said problems can be eliminated.

Thus, by comparison, the measurements shown in FIG. 4 clearly reveal that in the exemplary embodiment of the invention with a soldered ultrasonic transducer, the ultrasound propagation time can be measured reliably even at higher temperatures above 100° C.

The invention is not limited to the exemplary embodiments described here and the aspects emphasized therein. Rather, within the range indicated by the claims a multitude of modifications is possible, which lie within the scope of activities of a skilled person.

LIST OF REFERENCE NUMERALS

1 load-indicating connection component
10 connection element
12 screw head
14 surface
16 first solder layer
20 ultrasonic transducer
22 second solder layer
30 reactive layer
32 reacted reactive layer
40 laser
42 laser beam
50 punch
60 pressing device
61 base
62 linear unit for height adjustment
63 linear guideway
64 movable carriage of the linear guideway
65 stop
66 platform
67 weights
68 spring pin
69 spring pin receptacle
101 first curve
102 second curve
103 third curve

What is claimed is:

1. A method for producing load-indicating connection components (1), wherein a screw (10) and a piezoelectric ultrasonic transducer (20) are provided and interconnected, the method comprising:
   a) forming a layer structure on a surface (14) of the screw (10), which in this order proceeding from the surface (14) of the screw (10) comprises, a first solder layer (16), a reactive layer (30), a second solder layer (22), and the piezoelectric ultrasonic transducer (20),
      wherein the reactive layer (30) has a thickness in a range of 10 μm to 100 μm and is configured to melt the first solder layer (16) and the second solder layer

(22) via an exothermic reaction by activation with heat, electromagnetic radiation, or electric current,
wherein the surface (14) of the screw (10) is (i) a surface of a screw head of the screw (10) or (ii) a surface at an end of the screw opposite to the screw head, and
wherein the screw (10) is fabricated from steel, stainless steel, high-alloy steels, special steels, titanium, TiAl6V4, aluminum, nickel, amagnetic steel brass, copper, or an alloy of one of the forgoing;
b) pressing the piezoelectric ultrasonic transducer (20) toward the screw (10) with a specified contact pressure; and
c) activating the reactive layer (30).

2. The method according to claim 1, wherein the layer structure is formed by applying the first solder layer (16) onto the surface (14) of the screw (10) and applying the second solder layer (22) onto the piezoelectric ultrasonic transducer (20), cutting to size a reactive bonding foil that comprises the reactive layer (30), placing the reactive bonding foil onto the first solder layer (16) on the screw (10), and placing the piezoelectric ultrasonic transducer (20) onto the reactive bonding foil, wherein the second solder layer (22) points toward the reactive bonding foil.

3. The method according to claim 2, wherein the reactive bonding foil is cut to size in such a way that a shape of the reactive bonding foil corresponds to a shape of the piezoelectric ultrasonic transducer (20).

4. The method according to claim 2, wherein the reactive bonding foil is cut to size in such a way that a part of the reactive bonding foil is not covered by the piezoelectric ultrasonic transducer (20) after placing the piezoelectric ultrasonic transducer (20) onto the same.

5. The method according to claim 2, wherein the cutting to size of the reactive bonding foil is effected by means of laser cutting.

6. The method according to claim 1, wherein the layer structure is formed by coating a surface of the piezoelectric ultrasonic transducer (20) with the reactive layer (30) and placing the coated piezoelectric ultrasonic transducer (20) onto the surface (14) of the screw (10), wherein the reactive layer (30) faces the surface (14) of the screw (10).

7. The method according to claim 1, wherein the first solder layer (16) or the second solder layer (22) contains at least one adhesion-improving intermediate layer and a main layer comprising a solder material.

8. The method according to claim 1, wherein the specified contact pressure is specified in a range of 0.3 Mpa to 3 MPa.

9. The method according to claim 1, wherein the reactive layer (30) comprises a system of alternating layers, wherein the alternating layers are selected from Ni/Al, Al/Pd, Al/Ti, or Ti/Ni.

10. The method according to claim 1, wherein the surface (14) of the screw (10) is zinc-plated.

11. A load-indicating connection component (1) obtained by a method according to claim 1, wherein the load-indicating connection component (1) comprises a screw (10) and a layer structure arranged on the surface (14) of the screw (10), comprising in this order proceeding from the surface (14) of the screw (10) a reacted reactive layer (32) and the piezoelectric ultrasonic transducer (20).

12. A method for producing load-indicating connection components (1), wherein a screw (10) and a piezoelectric ultrasonic transducer (20) are provided and interconnected, the method comprising:

a) forming a layer structure on a surface (14) of the screw (10), which in this order proceeding from the surface (14) of the screw (10) comprises, a reactive layer (30), and the piezoelectric ultrasonic transducer (20),
wherein the reactive layer (30) has a thickness in a range of 10 μm to 100 μm and is configured to melt the first solder layer (16) and the second solder layer (22) via an exothermic reaction by activation with heat, electromagnetic radiation, or electric current,
wherein the surface (14) of the screw (10) is (i) a surface of a screw head of the screw (10) or (ii) a surface at an end of the screw opposite to the screw head,
wherein the screw (10) is fabricated from steel, stainless steel, high-alloy steels, special steels, titanium, TiAl6V4, aluminum, nickel, amagnetic steel brass, copper, or an alloy of one of the forgoing, and
wherein the surface (14) of the screw (10) comprises a first solder layer and a surface of the piezoelectric ultrasonic transducer (20) comprises a second solder layer;
b) pressing the piezoelectric ultrasonic transducer (20) toward the screw (10) with a specified contact pressure; and
c) activating the reactive layer (30).

13. The method according to claim 12, further comprising the step of cutting to size a reactive bonding foil that comprises the reactive layer (30), placing the reactive bonding foil onto the surface (14), and placing the piezoelectric ultrasonic transducer (20) onto the reactive bonding foil.

14. The method according to claim 12, wherein the layer structure is formed by coating a surface of the piezoelectric ultrasonic transducer (20) with the reactive layer (30) and placing the coated piezoelectric ultrasonic transducer (20) onto the surface (14) of the screw (10), wherein the reactive layer (30) faces the surface (14) of the screw (10).

15. A method for producing load-indicating connection components (1), wherein a screw (10) and a piezoelectric ultrasonic transducer (20) are provided and interconnected, the method comprising:

a) forming a layer structure on a surface (14) of the screw (10), the layer structure comprising a first solder layer (16), a reactive layer (30), and the piezoelectric ultrasonic transducer (20),
wherein the reactive layer (30) has a thickness in a range of 10 μm to 100 μm and is configured to melt the first solder layer (16) and the second solder layer (22) via an exothermic reaction by activation with heat, electromagnetic radiation, or electric current, and
wherein the first solder layer (16) is positioned either between the surface (14) and the reactive layer (30) and a surface of the piezoelectric ultrasonic transducer (20) comprises a second solder layer or between the reactive layer (30) and the piezoelectric ultrasonic transducer (20) and the surface (14) of the screw (10) comprises the second solder layer;
b) pressing the piezoelectric ultrasonic transducer (20) toward the screw (10) with a specified contact pressure; and
c) activating the reactive layer (30).

* * * * *